United States Patent [19]

Albrecht et al.

[11] 3,794,931

[45] Feb. 26, 1974

[54] ELECTRONIC GAIN CONTROL

[75] Inventors: Peter Albrecht, Manhattan Beach; Kenneth L. Bays, Huntington Beach, both of Calif.

[73] Assignee: The United States of America as represented by the Secretary of the Army, Washington, D.C.

[22] Filed: Oct. 10, 1972

[21] Appl. No.: 296,474

[52] U.S. Cl. ........................ 330/29, 330/86, 330/110

[51] Int. Cl. ................................................ H03g 3/30

[58] Field of Search.. 330/29, 35, 86, 110, 130, 137

[56] References Cited

UNITED STATES PATENTS

| | | | |
|---|---|---|---|
| 3,711,783 | 1/1973 | Kelling | 330/86 |
| 3,582,675 | 6/1971 | Jordan et al. | 330/86 X |

OTHER PUBLICATIONS

Carre et al., "Filters for Formant Synthesizers," IEEE Transactions on Audio and Electroacoustics, Vol. AU-18, No. 3, September, 1970 pp. 300–303.

*Primary Examiner*—H. K. Saalbach
*Assistant Examiner*—James B. Mullins
*Attorney, Agent, or Firm*—William G. Gapsynski; Lawrence A. Neureither; Jack W. Voigt

[57] ABSTRACT

An automatic gain control circuit is disclosed for varying the gain of an amplifier as a function of a separate control voltage. Feedback around the amplifier is varied independently from the amplifier output signal, changing the amplifier gain curve without changing the feedback control voltage therefor. Pulse-time modulation is used for feedback control with the pulse amplitude being proportional to the amplifier output and the pulse width a function of the control voltage. An electronic switch in the amplifier feedback path affords complete isolation between the driving voltage and the amplifier output signal. The switch is gated with a bistable multivibrator that is alternately triggered by pulses from a fixed pulse generator and pulses from a variable slope, ramp generator.

9 Claims, 2 Drawing Figures

ELECTRONIC GAIN CONTROL

BACKGROUND OF THE INVENTION

Difficulties encountered in directly varying amplifier gain as the function of a control signal usually result in varying the feedback around the amplifier. Present methods for varying the gain of an amplifier include use of electro-mechanical devices or diode function generators. Both methods have disadvantages. Electro-mechanical devices are bulky and have relatively slow response times. Diode function generators require fairly large currents, may be difficult to mechanize, and are difficult to make adjustable. Electronic variation of feedback includes photoelectric and magnetic controlled resistance, pulse-time modulation, frequency modulation, quarter-square multiplier and logarithmic multipliers. Pulse-time modulation requires the least hardware for accomplishing amplifier gain control and is adaptable for independent feedback control.

SUMMARY OF THE INVENTION

The apparatus of the present invention is an electronic gain control system for changing the gain curve of an amplifier without changing the feedback control voltage. Pulse-duration modulation (PDM) of the amplifier output signal is employed, with the pulse amplitude proportional to the amplifier output and the pulse width a function of the control voltage. One or more non-linearities in the amplifier gain curve can be provided as needed. The curve break points and slope of the amplifier output can be easily and independently adjusted. More than one amplifier channel can be controlled with a single control voltage. Complete isolation between the amplifier output signal and the feedback driving voltage is achieved through field-effect transistor (FET) switching during modulation of the feedback signal.

DESCRIPTION OF THE PREFERRED EMBODIMENT

Figure 1:
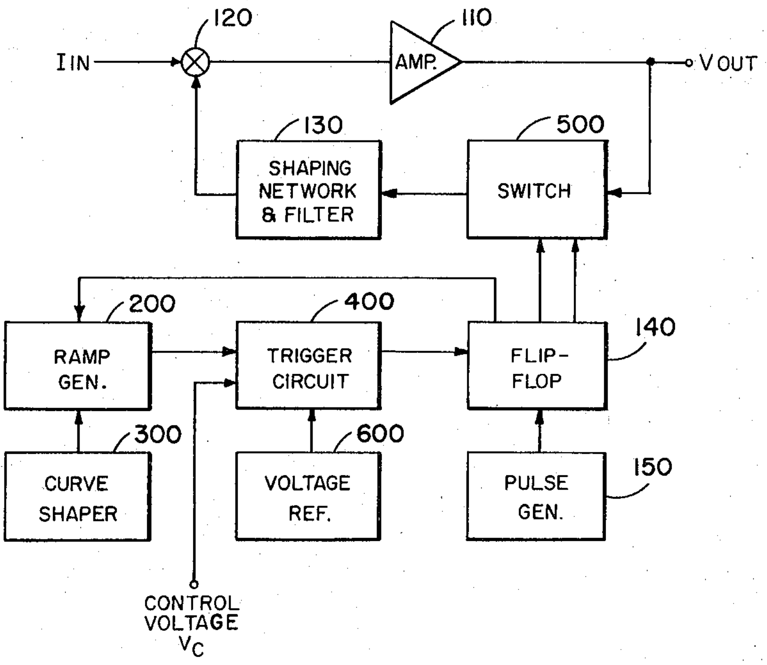
FIG. 1 is a block diagram of a preferred embodiment of the electronic gain control for a single amplifier channel.
Figure 2:
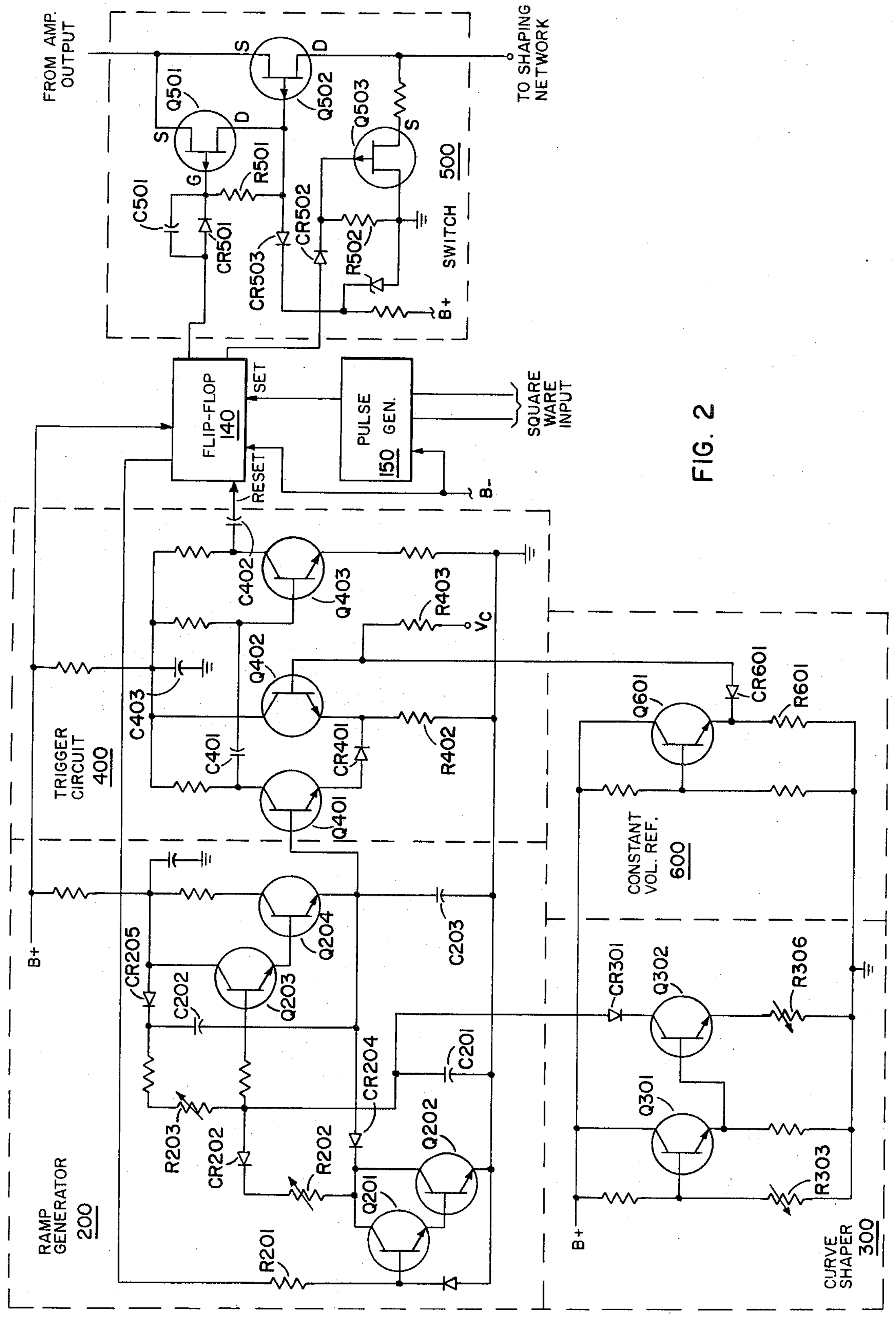
FIG. 2 is a partial schematic diagram of the gain control circuit of FIG. 1.

A preferred embodiment of the invention is set forth in FIGS. 1 and 2 wherein like numbers represent like parts in both figures. As shown in FIG. 1, an amplifier 110 has an input signal $I_{in}$ and an output signal $V_{out}$. The input signal is coupled to the amplifier through a mixer 120, the output at mixing point 120 being a function of the inputs at any instant. An electronic switch 500 has an input coupled to receive a portion of the amplifier output signal. A signal shaping network and filter 130 is connected between switch 500 and mixer 120 for coupling feedback signals to the mixer. A bistable multivibrator or flip-flop 140 provides PDM signals for gating switch 500 on and off. Control pulses for the flip-flop are provided from two sources. A pulse generator 150 provides periodic set signals to flip-flop 140 at a predetermined rate for starting each cycle. A trigger circuit 400 provides a time variable output pulse for resetting the flip-flop.

In gating the flip-flop, a ramp generator 200 provides periodic output pulses to trigger circuit 400. A curve shaper 300 is coupled to ramp generator 200 to allow the slope of the ramp output voltage from generator 200 to be changed. A constant voltage reference 600 and a control voltage $V_c$ are coupled to trigger circuit 400 for constraining the trigger pulse to occur only after each "set" signal. The trigger pulse is generated when the ramp generator output voltage offsets the control voltage in the trigger circuit. In response to a "set" signal from generator 150, flip-flop 140 gates the feedback signal through switch 500 and opens a discharge switch in the ramp generator. After a predetermined time the flip-flop is reset by trigger 400 and the discharge path is closed in the ramp generator.

As more clearly shown in FIG. 2, ramp generator 200 has a Darlington amplifier Q201–Q202, base coupled through a resistor R201 to an output of flip-flop 140. Changing the voltage level coupled from the flip-flop activates or deactivates the Darlington circuit. A power source (not shown) supplies B+ to the collectors of the Darlington amplifier, and the emitter of Q202 is connected to circuit ground. B+ is connected through a diode CR205, variable resistor R203, diode CR202 and variable resistor R202 to the collectors of Q201–Q202. A path is also provided from the cathode of CR205 through a capacitor C202 and diode CR204 to the collector of Q202. A pair of transistors Q203–Q204 are also connected as a double-emitter follower, Darlington amplifier, the collectors being connected to the anode of CR205 and B+, and the emitter of Q204 being connected through a capacitor C203 to ground. B+ is coupled from the junction of R203 and the anode of CR202 through a resistance to the base of Q203 for gating the transistor pair. A capacitor C201 is connected between ground and the anode of CR202 for controlling the current through Q203. The emitter of Q204 is further connected to the anode of CR204, providing a discharge path for C203 through Q201–Q202 when the Darlington amplifier is gated on.

Curve shaper 300 includes a transistor Q301 connected between B+ and ground, providing continuous current through an emitter load resistor to ground. A variable resistor R303 between ground and the base of Q301 controls the current through the transistor. A transistor Q302 has the emitter connected through a variable resistor R306 to ground and the base connected to the emitter of Q301 for receiving biasing voltage. The collector of Q302 is connected to the junction of C201 and CR202, providing a parallel capacitor discharge path with amplifier Q201–Q202. Varying R306 controls the amount of current passing through Q302, which in turn varies the current through the Darlington amplifier for a given time interval. Varying R303 controls Q302 turn-on point.

Trigger circuit 400 includes transistors Q401, Q402, and Q403. The base of Q401 is connected to the junction of the Q204 emitter and capacitor C203. The collector of Q401 is connected through a load resistance to B+ and through coupling capacitor C401 to the base of Q403. The emitter of Q401 is series connected through a diode CR401 and resistor R402 to ground. Q403 is emitter coupled to ground and collector coupled to B+. Bias voltage from B+ is resistance coupled to the base of Q403. An output signal coupling capacitor C402 is connected to the collector of Q403 for coupling reset signals to flip-flop 140. Transistor Q402 is collector coupled to B+ and has the emitter connected through the resistance R402 to ground. The control voltage $V_c$ is connected through a resistor R403 to the base of Q402, maintaining Q402 conductive and providing an emitter voltage across R402 for biasing Q401 off until the ramp input voltage thereto reaches a desired level. Variation in control voltage $V_c$ is limited to a fixed maximum by constant voltage reference 600. A transistor Q601 is coupled between B+ and ground and biased to provide a fixed voltage across emitter load resistor R601. A diode CR601 is forward coupled between the base of Q402 and the emitter of Q601. Any fluctuation of $V_c$ above the level of voltage developed across R601 results in current flow from $V_c$ through R403, CR601, and R601 to ground. This maintains an upper limit only to excursions of $V_c$.

Electronic switch 500 comprises field-effect transistors Q501, Q502, and Q503. The source electrodes (S) of Q501 and Q502 are connected in common to the output of amplifier 110. The drain (D) of Q502 is connected as an output to shaping network 130. The drain electrode of Q501 is connected to the gate electrode of Q502 and is further connected in the forward direction through a diode CR503 to B+. The two gates are connected together through resistor R501. In response to a "set" condition of flip-flop 140, a signal is coupled through a parallel diode-capacitor network, CR501 and C501, in the forward direction to the gate of Q501 for activating the switch. Q501 prevents excessive current from being introduced into the feedback signal path. The reset output of flip-flop 140 is coupled in the forward direction through a diode CR502 to the gate of Q503. A resistance path is connected between the drain of Q502 and the source of Q503. The drain of Q503 is grounded for shunting the feedback path when no feedback signal is desired. R502 is a shunt path for Q503 gate to ground. The zener diode sets a maximum voltage at Q502 gate.

In operation, pulse generator 150 responds to a predetermined square wave input frequency to produce the periodic "set" signal to flip-flop 140 which starts the cycle. Instantaneously, the flip-flop closes the series feedback switch (Q501 and Q502), opens the shunt feedback switch (Q503), and opens the ramp discharge switch (Q201). The flip-flop output driving signal coupled to the Q501 gate activates Q501-Q502. When closed, this direct-coupled switch provides series feedback through shaping network 130 and mixer 120 to the amplifier. Diodes CR501 and CR503 provide a driving voltage path which maintains isolation of the feedback signal from the driving signal. Shunt feedback switch Q503 is held open by the flip-flop during the "set" condition. A negative going pulse is also coupled from the flip-flop to the base of Q201 in the ramp generator, opening this switch and allowing the ramp charging cycle to begin. When Q201–Q202 are deactivated, capacitors C201, C202, and C203 begin charging through CR205. After a predetermined time the voltage developed across C203 has reached a level sufficient to overcome the biasing effect across R402 and activates Q401. Similarly, C201 has reached a level sufficient to activate Q203–Q204. When activated, Q401 is sustained through Q204. A pulse is generated on the collector of Q401, coupled across capacitor C401 and deactivates Q403. When Q403 is turned off a trigger circuit reset pulse is coupled through C402 to reset the flip-flop. Resetting the flip-flop turns off Q501 and Q502 and activates Q503 which provides a constant source impedance for the shaping network. A positive signal is also coupled to the base of Q201 in the ramp generator to close the ramp discharge siwtch, Q201-Q202. When the ramp discharge switch activates, a discharge path is provided therethrough for C203, turning off Q401. Q201-Q202 also provide a parallel path with the curve shaper transistor Q302 across capacitor C201, allowing C201 to discharge to a level which turns off Q203-Q204.

Thus, there is a time interval between the application of a "reset" trigger pulse to the flip-flop and the succeeding pulse generator "set" pulse. This interval of time allows the capacitors in the ramp generator to discharge. The time interval that feedback switch Q501–Q502 is closed can be represented by $t$, the ramp voltage by $V_r$ and the ramp slope by A, then mathematically $V_r = tA$. The trigger pulse occurs when $V_r$ is equal to $c$, therefore $V_c = V_r = tA$; and $t = V_c/A$. From this expression it is apparent that $t$ can be changed by changing slope A and leaving $V_c$ unchanged. The curve shaper allows the ramp slope to be changed, thereby altering $t$ as a function of $V_c$. The controllable, constant current into Q201 allows the ramp to have a constant slope. Removing part of this current reduces the slope and changes the relationship between $t$ and $V_c$. Both the break point and the slope are separately adjustable by variable resistors R303 and R306. When the slope of the ramp voltage is decreased, it takes longer for $V_r$ to rise to the value of $V_c$. It is therefore possible that the trigger pulse would not be generated before the next pulse generator output, which would reset the trigger circuit before an output pulse was generated. The constant voltage reference 600 prevents premature resetting of the trigger circuit. Its voltage is preselected to provide an upper limit of $V_c$ as seen by the comparator circuit of Q402. Thus, $V_c$ never rises above a point that prevents generation of a trigger pulse, allowing the amplifier to assume a constant gain when $V_c$ rises above the limiting value. The amplifier output voltage is, therefore, independently controlled by feedback of the output voltage varying as a function of the control voltage, $V_c$. Since $V_c$ equals $tA$, when the slope A is changed, the capacitor charge time in the ramp generator is changed, changing the interval between the set and reset pulses and thereby varying the length of time in which the amplitude of $V_{out}$ is coupled back to the amplifier input.

Obviously many modifications and variations of the present invention are possible in the light of the above teaching. For example, more than one curve shaper can be used with the ramp generator. Several switching circuits may be connected in parallel to control plural amplifiers. It is therefore to be understood that, within the scope of the appended claims, the invention may be practiced other than as specifically described.

We claim:

1. An electronic gain control circuit for varying the feedback of an amplifier and comprising: an electronic switch having a signal input and output, said switch being connected between the output of said amplifier and the input of said amplifier for providing an amplifier feedback signal; gating means coupled to said switch for opening and closing the switch, said gating means including a flip-flop having first and second outputs for coupling two stable output states simultaneously to said switch for activating and deactivating said switch and having first and second inputs, a pulse generator connected to said first input of the flip-flop for coupling a controlled series of pulses thereto and a trigger circuit connected to said second flip-flop input for resetting said flip-flop; and timing means coupled to said gating means for controllably varying the gating period thereof.

2. An electronic gain control circuit as set forth in claim 1 wherein said timing means comprises: a ramp generator coupled to said trigger circuit for periodically changing the state thereof, thereby resetting said flip-flop, and a curve-shaper connected to said ramp generator for varying the time period of said ramp generator; and said flip-flop having a third output coupled as an input to said ramp generator for starting and stopping a ramp cycle.

3. An electronic gain control circuit as set forth in claim 2 wherein said ramp generator comprises: a double-emitter follower input responsive to said third flip-flop output, first and second charge storage networks connected across said double-emitter follower, and an output connected between said second charge storage network and said trigger circuit for changing the state of said trigger circuit; and said curve shaper is connected to said first charge storage network across said double-emitter follower.

4. An electronic gain control circuit as set forth in claim 3 wherein said curve shaper comprises: first and second transistors; said first transistor having the base and collector connected to biasing voltage and the emitter to a grounded resistor for maintaining continuous current therethrough, and a variable resistance connected between the base and a circuit ground return for changing the bias thereof; the base of said second transistor being coupled to the emitter of said first transistor for biasing said second transistor, a variable resistor coupling the emitter of said second transistor to ground, and a blocking diode connected between the collector of said second transistor and the first charge storage network of said ramp generator for controlling charging rate of said network when said double-emitter follower is activated.

5. An electronic gain control circuit as set forth in claim 2 and further comprising a control voltage coupled as an input to said trigger circuit for controlling the voltage level at which the trigger circuit activates, and a reference voltage source coupled to said trigger circuit for regulating the maximum level of control voltage activation.

6. An electronic gain control circuit as set forth in claim 5 wherein said trigger circuit comprises: first, second and third transistors; said first transistor having the base thereof coupled to receive the output of said ramp generator, a capacitor coupling the collector of said first transistor to the base of said third transistor for switching the state thereof; an output capacitor coupled between the collector of said third transistor for coupling a reset signal to said flip-flop; the base of said second transistor being directly coupled to said reference voltage source and resistively coupled to said control voltage; a resistance coupled between the emitter of said second transistor and ground; and a diode coupled between the emitters of said first and second transistors.

7. An electronic gain control circuit as set forth in claim 6 wherein said ramp generator comprises: a double-emitter follower input network responsive to said third output of said flip-flop, first and second charge storage networks connected across said double-emitter follower, and an output connected between said second charge storage network and said trigger circuit for changing the state of said trigger circuit; and said curve shaper is connected to said first charge storage network across said double-emitter follower.

8. An electronic gain control circuit as set forth in claim 7 wherein said flip-flop is a bistable multivibrator, and said electronic switch comprises: a direct-coupled, field-effect transistor switch connected between said amplifier output and input for providing controlled amplifier feedback, a parallel diode-capacitor network connected between a gate of said direct-coupled switch and a first of said flip-flop stable outputs for activating said switch; and a field-effect transistor switch shunt connected between the output of said direct-coupled switch and ground for terminating amplifier feedback signals, said shunt having a gate coupled to the second of said flip-flop outputs for deactivating said switch.

9. An electronic gain control circuit as set forth in claim 8 wherein said curve shaper comprises: first and second transistors; said first transistor having the base and collector thereof connected to biasing voltage and the emitter to a grounded resistor for maintaining continuous current therethrough, and a variable resistance connected between the base and ground for changing the transistor bias; said second transistor having the base connected to the emitter of said first transistor for biasing said second transistor, a variable resistor connected between the emitter of said second transistor and ground, and a diode connected between the collector of said second transistor and the first charge storage network of said ramp generator for controlling charging rate of said network when said double-emitter follower is activated; and said gain control circuit further comprising a shaping network connected between the output of said direct-coupled switch and said amplifier input.

* * * * *